United States Patent [19]

Day et al.

[11] 4,231,052

[45] Oct. 28, 1980

[54] APPARATUS FOR PARALLEL-IN TO SERIAL-OUT CONVERSION

[75] Inventors: Derek J. Day; Charles T. Elliot, both of Malvern, England

[73] Assignee: The Secretary of State for Defence in Her Britannic Majesty's Government of the United Kingdom of Great Britain and Northern Ireland, London, England

[21] Appl. No.: 956,960

[22] Filed: Nov. 2, 1978

[30] Foreign Application Priority Data

Nov. 4, 1977 [GB] United Kingdom ............... 45995/77

[51] Int. Cl.² .......................................... H01L 29/78
[52] U.S. Cl. ...................................... 357/24; 357/30; 307/221 D
[58] Field of Search .................... 250/370; 357/24, 30, 357/31; 307/221 D

[56] References Cited

U.S. PATENT DOCUMENTS 3,995,159  11/1976  Elliot .................................. 250/370

Primary Examiner—Martin H. Edlow
Attorney, Agent, or Firm—Pollock, Vande Sande & Priddy

[57] ABSTRACT

Apparatus for parallel-in to serial-out conversion comprises a strip of semiconductor material having electrical contacts at either end, and a detector near one end, sensitive to the local density of ambipolar carriers. Minority carriers (or ambipolar carriers) are injected into the strip at a number of parallel inputs and a spatial distribution of ambipolar carriers accumulated along the strip. The ambipolar carriers are swept to the detector when a pulse of current of suitable amplitude and duration is applied to the contacts. The parallel inputs may be in the form of diode diffusions to which electrical signals may be applied. Alternatively the inputs may be lateral extended portions of the strip and in these ambipolar carriers may be generated, for example, photoelectrically.

Two-dimensional radiation detector arrays using the invention are also described.

10 Claims, 7 Drawing Figures

APPARATUS FOR PARALLEL-IN TO SERIAL-OUT CONVERSION

This invention relates in general to a method and apparatus for parallel-in to serial-out conversion. The invention has particular application to optical imaging and to signal processing.

Charge Coupled Devices have been used for both these particular applications. The application of Charge Coupled Devices to Infrared Detection and Imaging systems, for example, has been the subject of considerable recent interest and a review is given in "The Proceedings of the IEEE Vol 63 No. 1 Pp 67–74, Jan. 1975".

In a typical Infrared Charge Coupled Device (IRCCD) imaging system, an infrared image is focussed upon an array of discrete photodetector elements. These elements co-operate in parallel with a CCD shift register so that, after a predetermined exposure time, an analogue charge packet is accumulated in each one of a corresponding number of storage locations in the register. When a synchronized succession of voltage pulses is applied to the register in a conventional manner, the charge packets are transferred from location to location under the influence of electrical fringe fields. A pulsed serial output signal is provided by detection of the charge packets at one end of the register. It is a disadvantage of systems of this type that the signal handling capacity is limited, not so much by the photodetectors but by the dynamic range/charge handling capacity of the CCD shift register. The efficiency of the CCD also sets a limit upon both operational speed and the number of photodetectors that can be incorporated in the array. These limitations are particularly significant when far infrared (eg 8–4 microns) detection and imaging applications are considered. In this case higher operational speeds become necessary as the photodetector exposure times ($\sim 10$ microseconds) are limited by the background flux and the limited capacity of the CCD.

An alternative type of infrared imaging device is described in U.K. Pat. No. 1,488,258 (U.S. Pat. No. 3,995,159). Such a device includes an elongated strip of photoconductive material to which are attached two current electrodes. A third electrode is situated between these two current electrodes at one end of the strip to provide signal readout. When an infrared strip image is scanned along the strip, the infrared photons create electron hole pairs in an active region of the strip, thereby increasing the local majority and minority carrier densities above their thermal equilibrium values. The charge of the minority carriers is effectively neutralized by majority carrier screening, the screened minority carriers being termed "ambipolar carriers."

The image is so scanned along the length of the strip, and the current is so chosen that the ambipolar carrier drift velocity, and the velocity of the image, are matched. In this manner the ambipolar carriers are accumulated in parallel and in register with the image, and drift towards the third electrode where they are detected to produce a serial output signal. Typical usable drift velocities are fast, however, and a single device as described requires a fast scanning mechanism for matching purposes. With suitable scanning optics an infra-red scene may be scanned strip by strip in raster manner, but the high scan speeds necessary for such a system are a disadvantage.

U.S. Pat. No. 3,111,556 describes an infra-red imaging device where minority carriers are generated by input radiation incident upon a strip of photoconductive semiconductor material. After illumination, the minority carriers are caused to drift along the strip and the radiation pattern incident therealong is translated into a varying voltage level by switching a potential gradient on for a predetermined length of time. It is a disadvantage in imaging devices of this kind, however, that the carrier distribution is strongly dependent on quantum efficiency and carrier lifetime and requires substantial material uniformity to avoid the obvious results of pattern sensitivity, particularly for low contrast scenes.

According to this invention, there is provided a method for parallel-in serial-out conversion comprising the following steps: firstly, injecting carriers at a plurality of discrete inputs, and accumulating thereby along the length of a substrate of semiconductor material in an active region thereof situated between a first current electrode and a detector, a corresponding standing distribution of ambipolar carriers; secondly, after substantial accumulation has taken place, applying through the substrate a readout pulse of electric current, the readout pulse being of such matched amplitude and duration that the corresponding distribution of ambipolar carriers is swept towards the detector along the entire length of the active region without excessive diffusion spread of the distribution and without excessive thermal dissipation; thirdly, detecting during the duration of the pulse a parameter dependant upon local ambipolar carrier density and producing thereby a serial output signal.

The inputs may include an array of diodes formed in the substrate situated between the first current electrode and the detector, and electrical signals in the form of biased voltages applied to the diodes via synchronous gates to enable carrier injection. The injection period may be limited by select input timing and by operation of the synchronous gates. However, the diode inputs may be fed continuously, the injection period effectively being terminated as the ambipolar carriers are swept away in response to the readout pulse.

Alternatively carriers may be injected by the transfer of ambipolar carriers from extended inputs integral with the substrate.

Apparatus for performing the method above, comprises: a substrate of semiconductor material capable of temporarily sustaining a spatial distribution of ambipolar carriers; first and second spaced current electrodes in electrical contact with the substrate detector means situated between the first and second current electrodes, the detector means being responsive in use to a parameter dependent upon a local density of ambipolar carriers for providing a serial output signal; and multiple input means for injecting information carriers and accumulating in an active region of the substrate situated between the first current electrode and the detector means, a corresponding distribution of ambipolar carriers.

The multiple input means may include an array of spaced diodes formed in the substrate between the first current electrode and the detector means, the diodes being provided with input connectors to enable application of external electrical signals and the injection of information (ie minority) carriers. In this form of the apparatus, the input diodes thereof may be connected to the outputs of a corresponding number of image detectors. In this way and with suitable arrangement of the detectors a serial output 2-dimensioned detector array may be provided.

Alternatively, the multiple input means may include a plurality of detector regions co-extensive with the substrate of semiconductor material. In this case, information carriers may be injected into the active region by the transfer of ambipolar carriers from the detector region.

The detector means may be provided by an output diode formed on the substrate. Alternatively, the detector means may include a third electrode spaced a predetermined distance apart from the second current electrode. The output may be taken, however, across a pair of electrodes a predetermined spacing apart and a predetermined distance from the first current electrode.

Preferably the apparatus further includes: driving means adapted to provide current pulses of predetermined amplitude and duration, an output gate connected to the detector means, and arranged to operate synchronously with the driving means, for separating the output signal into first and second parts; a delay means connected to the output gate for delaying the first part signal by a time equal in duration to its temporal length, to produce a delayed signal; and subtractor means connected to the output gate and to the delay means for subtacting the second part signal from the delayed signal to produce a corrected signal.

The invention will now be described by way of example only, and with reference to the following drawings in which.

Figure 1:
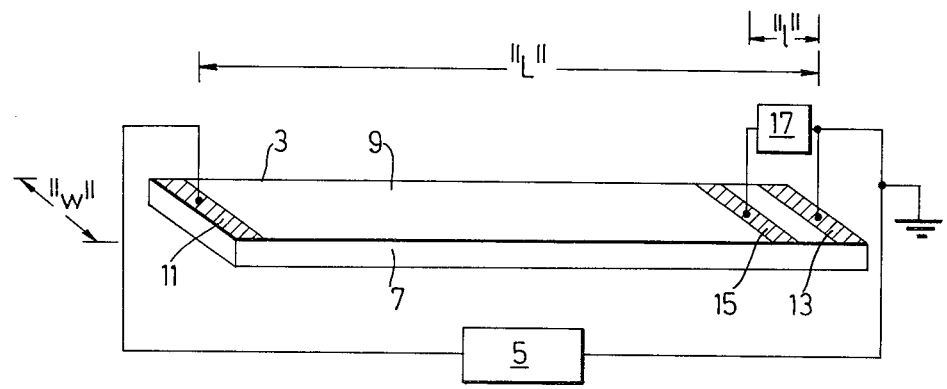
FIG. 1 is a diagram, partly in perspective form and partly in circuit form of apparatus including a transfer device constructed in accordance with this invention.

As shown in FIG. 1 conversion apparatus comprises a transfer device 3 and connected across this, a current pulse generator 5. The transfer device is in the form of an elongated strip 7 of semi-conductor material. Deposited at respective ends of the strip 7 are two metallic electrodes, 11 and 13, for example, of aluminum, spaced a distance L apart; and an electrode 15, for example, of aluminum, spaced a distance 1 from electrode 13, is deposited between. Electrodes are deposited in conventional manner to provide ohmic contact with the substrate strip 7. The electrodes 11 and 13 are electrically connected to the pulse generator 5 so that a pulsed sweep current may be driven to flow lengthwise through the strip 7 between these electrodes. The electrodes 13 and 15 are connected across a readout output circuit 17, essentially a high impedance amplifier for detecting the voltage developed across electrodes 13 and 15 when current is caused to flow between the electrodes 11 and 13.

Normally the transfer device 3 would be cooled to low temperatures to reduce thermal noise. Thus typically the transfer device 3 would be cooled to 77° Kelvin in a liquid nitrogen cooling vessel (not shown), whereas generator 5 and output circuit 17 would be outside the vessel at room temperature. Conventional encapsulation is employed to isolate thermally parts of the conversion apparatus while allowing appropriate electrical connection.

In this apparatus information carriers are injected into the transfer device 3 at a number of parallel inputs (not shown) and accumulated as a corresponding standing distribution of ambipolar carriers. The semiconductor material, therefore, must be capable of sustaining this distribution at least for a period of time sufficient to allow both time for the accumulation of this distribution and time for its detection subsequent to this accumulation.

The minimum spacing between inputs of the transfer device 3 is limited by diffusion of the accumulated ambipolar carriers. Thus where a time 't' seconds has transpired between the start of ambipolar carrier accumulation and ultimate detection of these carriers, the diffusion spread 'λ' is given by the expression:

$$\lambda = \sqrt{D \cdot t} \quad ; t \leq \tau \quad (1a)$$

Where 'D' is the diffusion constant corresponding to the diffusion of ambipolar carriers in semiconductor material:

$$D = \mu k T/q \quad (2)$$

'μ' being the ambipolar mobility, 'kT' the thermal kinetic energy corresponding to operating temperature 'T' Kelvin and 'q' is the effective (dynamic) carrier charge. The maximum diffusion spread 'λmax' is given by the expression:

$$\lambda_{max} = \sqrt{D \cdot \tau} \quad ; t \geq \tau \quad (1b)$$

Where 'τ' is the lifetime of the minority carriers.

So that minimum attainable input spacing is achieved rather than dictated by detector geometry the spacing 'l' between electrodes 13 and 15 is chosen to have a value approximately twice that of the diffusion length:

$$l \approx 2\lambda \quad (3a)$$

The effective width of the resolvable regions between inputs is similarly defined, the width 'w' of the substrate 7 being chosen typically as:

$$w \approx l \approx 2\lambda \quad (3b)$$

The length 'L' of the element 3 may be considered as divided into 'n' resolvable regions of length 'l' width 'w' and into which information may be applied in parallel; thus:

$$n \approx L/l \approx l/2\lambda \quad (4)$$

Suppose then that before information carriers are injected a current pulse is applied to clear the device 3 of ambipolar carriers. The minority and majority carriers present in the substrate rapidly attain their thermal equilibrium densities, and as information carriers are injected into the device an excess distribution of ambipolar carriers is accumulated.

Initially, as more and more carriers are injected, the ambipolar density distribution increases. However, as the injection time approaches the minority carrier lifetime, the process of ambipolar carrier recombination begins to compete.

It is better to limit the injection time and to rapidly sweep the corresponding distribution to the detector output electrode 15 to avoid loss of output signal level and resolution. A readout pulse of current is applied by means of the generator 5 to sweep the distribution towards the detector electrode 15. As ambipolar carriers are swept into the volume of the semiconductor material between electrodes 13 and 15, the interelectrode resistance is modulated. An output voltage '$\phi$' is thus generated between these electrodes which is related to the localized ambipolar carrier density:

$$\phi = \phi_o + \Delta\phi \qquad (5a)$$

Where the pedestal voltage '$\phi_o$' and modulation signal voltage '$\Delta\phi$' depend on material resistivity:

$$\phi_o = I_o \rho_o l / A \qquad (5b)$$

$$\Delta\phi = I_o \Delta\rho l / A \qquad (5c)$$

$I_o$ being the pulse current amplitude; '$\rho_o$' the equilibrium value of resistivity for the semiconductor material '$\Delta\rho$' being the average change in the resistivity due to excess injected ambipolar carriers in the localized volume; and 'A' the material cross-section normal to the current flow.

The output voltage $\phi$ is detected and amplified by means of the output circuit 17.

Figure 2:
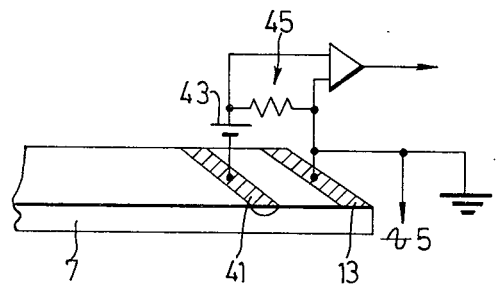
FIG. 2 is a diagram partly in perspective form and partly in circuit form of part of a transfer device having an output structure alternative to that of the device shown in FIG. 1.

An alternative form of output structure is shown in FIG. 2. In this case the electrode 15 is replaced by a non-ohmic electrode 41 for example, a p-type region forming a p-n junction with a strip 7 (if n-type material) the junction being reverse biased for operation, by battery 43, and connected to an integrating output circuit 45. Since the signal resolution is diffusion limited, the optimum time constant $T_c$ for the output circuit 45 is given by the expression:

$$T_c \approx 2\lambda/v \qquad (6)$$

Typically, $T_c = 0.02$ micro-seconds; where v is the carrier drift velocity.

Figure 3:
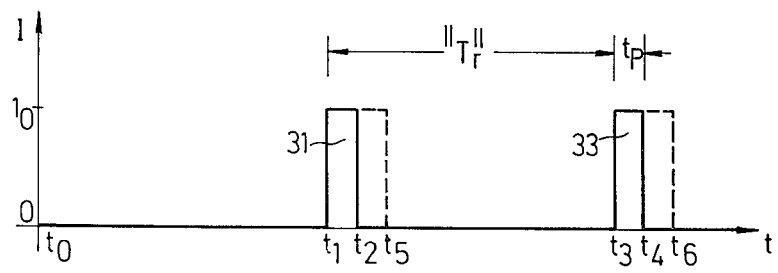
FIG. 3 is a graphical representation of a succession of electrical current pulses suitable for operation of the device shown in FIG. 1.

The system described above may be operated with or without input gating. Where injection is continuous, however, the effective injection period is defined by suitably time, clear/readout pulses. The characteristics of pulses suitable for this purpose are illustrated in FIG. 3.

The pulses are of substantially square form of amplitude '$I_o$' and pulse duration '$t_p$', repeated for continuous operation in period '$T_r$'.

Consider injection starting at time '$t_o$'. During the initial period '$t_o$' to '$t_1$' the current flowing through the strip 7 is held at substantially zero value. The ambipolar carriers injected into strip 7 are allowed to accumulate until at time '$t_1$' a readout pulse 31 is applied. At '$t_1$' however, the current is switched rapidly from zero to finite value '$I_o$' and a field 'E' is produced in the strip. The field causes a drift of both majority and minority carriers, and ambipolar carriers flow towards the detector electrode 15. The velocity 'v' of the ambipolar carriers is given by the expression:

$$v = \mu_a E = \mu_a I_o \rho_o / A \qquad (7)$$

In order that the whole distribution of ambipolar carriers accumulated in the strip length 'L' is swept towards the detector electrode 15 and out via the current electrode 13, the duration $t_p$ of the pulse must be no less than the maximum time of transit '$t_m$':

$$t_p \geq t_m = L/v \qquad (8)$$

This leads to a limitation in pulse shape:

$$I_o t_p \geq LA/(\mu_a \rho_o) \qquad (9)$$

The current '$I_o$' is necessarily limited to low values to avoid substantial heating arising from Joule dissipation, which would otherwise give rise to large noise content and instability.

Since injection is, in this case, continuous, ambipolar carriers will continue to accumulate while the distribution is swept across the element 3. However, the ambipolar distribution is no longer in fixed register with the inputs, and consequently in the period '$t_p$' undesirable cross-talk is added to the distribution. To avoid serious corruption of the distribution the maximum transit time $t_m$ should be short compared with the minimum period of injection $(T_r - T_p)$ $$t_m << T_r - t_p \qquad (10)$$

Thus, as the current pulse passes in the interval $t_1 - t_2$ the distribution is read out and the device cleared before the next distribution is accumulated. Readout pulse 31 thus acts as the clearing pulse for the next readout pulse 33.

Typical values for system parameters are given as follows:

CMT at 77 K $\tau = 2$ μsec; $\mu_a = 500$ cm²/volt. Sec, $\rho_o \sim 6 \times 10^{-2}$ Ω.cm
$\lambda = 25$ m
$\eta = 10$, $l = w = 50$ μm, $L = 500$ μm, thickness $\sim 10$ μm
$T_r = 2$ μsec; $t_p = 0.2$ μsec, $I_o \approx 40$ m amps.

The effect of cross-talk may be considerably reduced by signal processing. As shown in FIG. 3, the driving pulse 31 may be of extended duration (see broken outline), the interval $t_1 - t_5$ being twice the minimum readout duration $t_m$.

Figure 4:
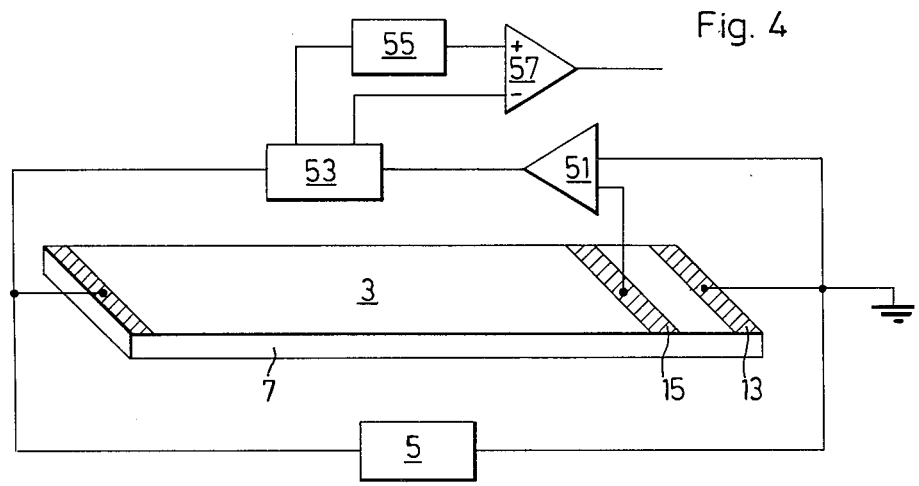
FIG. 4 is a diagram, in circuit form, of the apparatus of FIG. 1 adapted to provide a corrected signal.

As before, the output signal is detected in the period $t_1 = t_2$ but during detection, cross-talk is added to the information already accumulated. In the further interval $t_2 - t_5$ only cross-talk information is accumulated. Apparatus suitable for using this latter information, to provide an improved signal, is shown in FIG. 4. The output voltage generated between electrodes 13 and 15 is first amplified by a high impedance amplifier 51. The amplified signal is then gated by a synchronous gate 53. The operation of this gate 53 is synchronized to the pulses provided by generator 5 so that the first part of the output signal containing cross-talk + true information is channelled via a delay line 55 and fed to the adding input of a differential amplifier 57 after a delay $t_m$. The gate is switched at $t_2$ so that the second part of the output signal corresponding to the latter half of pulse 31 ($t_2-t_5$) and containing only cross-talk information is channelled directly to the subtracting input of the amplifier 57. The two parts of the signal are subtracted leaving a corrected image signal.

One form of the transfer device described above is shown in FIG. 5. A transfer 3' in the form of an elongated strip 7' of semiconductor material, is provided with an array of input diodes $D_1, \ldots, D_5$ spaced a distance "l'" apart along its length "L'". The material may be lightly doped n-type silicon, the diodes being formed by p-type diffusions. A corresponding array of input electrodes $E_1, \ldots, E_5$ (eg of aluminum) are deposited to form ohmic contact with the diodes $D_1, \ldots, D_5$ respectively. Deposited at respective ends of the strip 7' are two metallic (eg aluminum) current electrodes 11' and 13', and deposited between these, a distance l' from electrode 13', a detector electrode 15' (eg aluminum).

The distance l' is determined by diffusion as before:

$$l' \approx 2\lambda \qquad (11)$$

where $\lambda$ is the appropriate operational diffusion length. Electrical voltages $V_1, \ldots V_5$ are applied to the diodes $D_1, \ldots, D_5$ in parallel by synchronous gates 61, 62, 63, 64 and 65. Electrodes 11' and 13' are connected across the current pulse generator 5' and electrodes 13' and 15' are connected across an output amplifier circuit 17'.

The gates $61, \ldots, 65$ are operated to open after each readout pulse has been applied by generator 5'. With these gates open, minority carriers are injected into diode regions $D_1, \ldots, D_5$ and in a short relaxation time an ambipolar distribution is accumulated corresponding to the magnitude of the reverse biased voltages $V_1, \ldots, V_5$. Injection is then terminated by closure of the synchronous gates $61, \ldots, 65$, before a readout pulse of current is applied to sweep the entire corresponding standing distribution to the detector output electrode 15'. To avoid excessive loss due to recombination, the readout pulse must be applied after an interval following the start of injection not substantially greater than the minority lifetime characteristic of the material.

Figure 5:
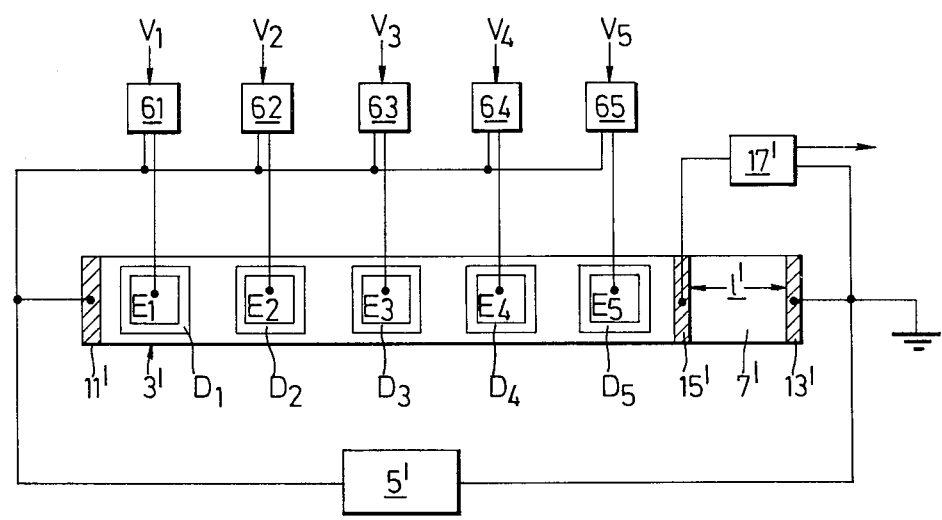
FIG. 5 is a diagram, partly in plan, and partly in circuit form, illustrating apparatus including a transfer device having a multiplicity of diode inputs.

The device shown in FIG. 5 may also be readily adapted to perform as a signal complimented imaging device. The substrate, for this example, is of photo-conductive material and may be scanned optically to provide a distribution of ambipolar carriers. Upon this distribution, may be super-imposed a signal distribution injected via diodes $D_1, \ldots, D_5$. The signal distribution may be additive —for example, presenting other image information, or it may be subtractive—for example, improving signal level.

Figure 6:
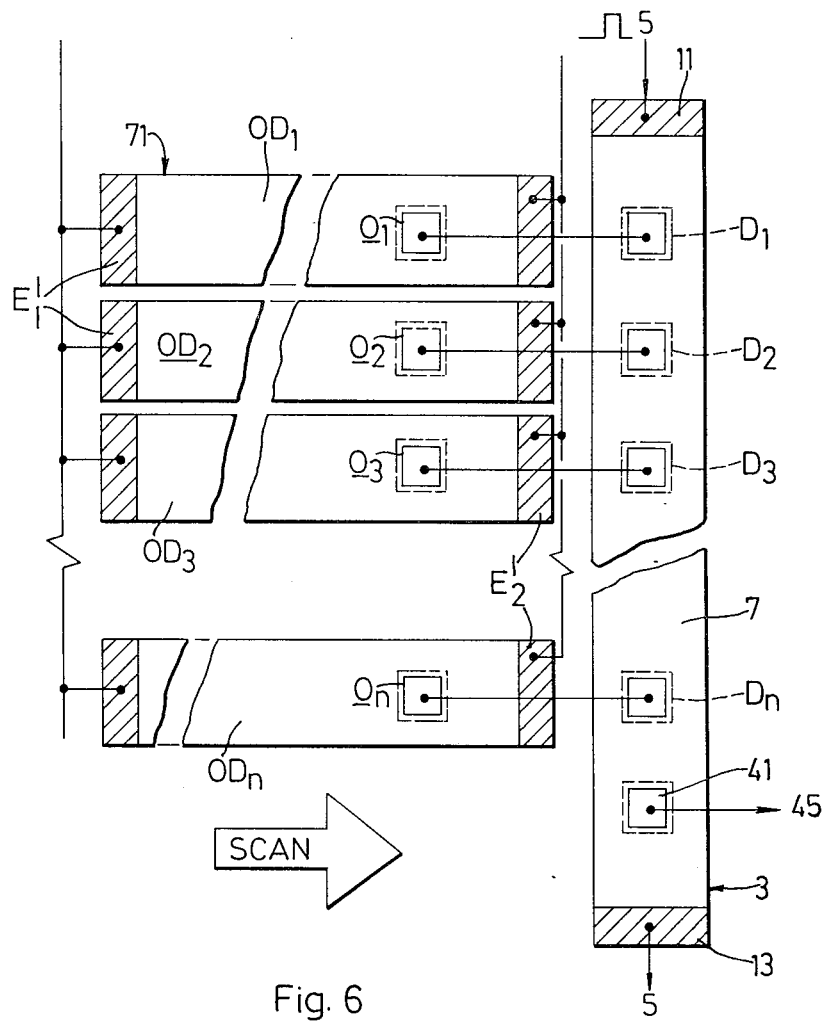
FIG. 6 is a plan diagram of a hybrid detector array including the transfer device shown in FIG. 5.
Figure 7:
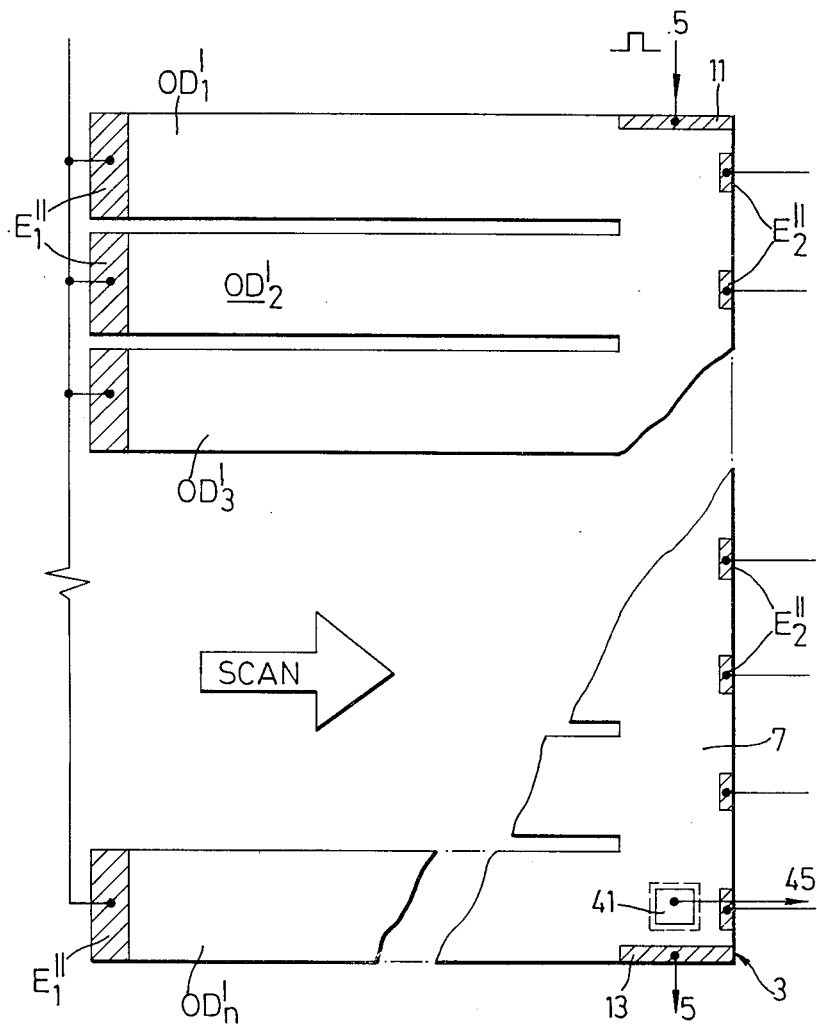
FIG. 7 is a plan diagram of an integrated detector array including the combination of a transfer device and a plurality of co-extensive detector regions.

Two arrangements of the transfer device 3, suitable for use in optical imaging, are shown in FIGS. 6 and 7. In FIG. 6, the transfer device 3 is part of a hybird detector array 71. This array includes a number of optical imaging detectors $OD_1, OD_2, \ldots, OD_n$, the outputs $O_1, O_2, \ldots, O_n$ of which are electrically connected to diode inputs $D_1, D_2, \ldots, D_n$ formed in the substrate 7 of device 3. The imaging detectors are preferably of the kind described in U.K. Pat. No. 1,488,258 (U.S. Pat. No. 3,995,159) and are used in conjunction with an optical scanning system. In operation, current is caused to flow along detectors $OD_1, OD_2, \ldots, OD_n$ by applying a voltage between end electrodes $E_1', E_2'$ respectively.

When the upper surfaces of detectors $OD_1, OD_2, \ldots, OD_n$ are exposed to focussed optical radiation, ambipolar carriers are photoelectrically generated in the substrate material of each detector and caused to drift towards detector diodes $O_1, O_2, \ldots, O_n$ near the ends of the detectors. As taught in U.K. Pat. Ser. No. 1,488,258 the drift velocity of these carriers and the scan velocity of the image incident upon each detector are synchronized so that integration occurs during carrier transit. As these ambipolar carriers are detected, they produce electrical variations and charge carriers are injected via the connected input diodes $D_1, D_2, \ldots, D_n$ of the transfer device 3. In this way ambipolar carriers are accumulated in the transfer device 3. Since the transfer device 3 is separate from the imaging detectors $OD_1, OD_2, \ldots, OD_n$, the constituent semiconductor materials may be selected to suit the different functions of detection and conversion, respectively. In particular, for image detection in the 8-14 micron band of the infra-red spectrum, 8-14 micron band type Cadmium Mercury Telluride material (eg. Cd 0.21 Hg 0.79 Te) may be used for the detectors, while 3-5 micron band type Cadmium Mercury Telluride material (eg. $Cd_{0.30} Hg_{0.70} Te$) may be used for the transfer device 3.

In FIG. 7 the imaging detectors $OD_1', OD_2', \ldots, OD_n'$ and the transfer device 3 are fabricated from a single slice of semiconductor material. The detectors $OD_1', OD_2', \ldots, OD_n'$ are separated along their length by slots cut in the material; cut, for example, by an etching and photolithographic process. Each detector has a current electrode $E_1'$ at its far end. At its rear end where it extends from the transfer device 3 spaced from the junction is another electrode $E_2''$. In operation, when electric potential is applied between electrode pairs $E_1''$; $E_2''$, ambipolar carriers are caused to drift along each detector towards electrodes $E_2''$. As the carriers approach electrodes $E_2''$ they drift into a common region of the semiconductor material that is shared by detectors $OD_1', OD_2', OD_n'$ and transfer device 3. In each of FIGS. 6 and 7, when an electrical pulse is applied between device electrodes 11 and 13, the accumulated ambipolar carriers are swept towards electrode 13 and to the detecting diode 41 to produce an output at 45.

I claim:

1. A transfer device for converting information in parallel form to information in serial form comprising:
   a substrate of semiconductor material capable of sustaining spatial distribution of ambipolar carriers; first and second current electrodes formed on the subtrate a spaced distance apart; detector means situated between the current electrodes for detecting a parameter dependant upon a local density of ambipolar carriers when current is applied between the current electrodes, and the ambipolar carriers are caused to drift towards the detector means; and a plurality of inputs situated between the first current electrode and the detector means, for injecting information carriers into an active region of the subtrate between the electrodes, and for enabling thereby the accumulation of the spatial distribution of ambipolar carriers.

2. A transfer device according to claim 1 wherein the plurality of inputs are provided by an array of diodes formed on the semiconductor material between the first current electrode and the detector means.

3. A transfer device according to claim 2 in combination with a plurality of discrete optical imaging detectors, the combination providing a hybrid detector array, each detector having an output electrically connected to a corresponding one of the input diodes of the transfer device.

4. A hybrid detector array according to claim 3 wherein the substrate of the transfer device is of 3 to 5 micron band type Cadmium Mercury Telluride material and the discrete detectors are adapted to detect infrared radiation in the 8 to 14 micron band.

5. A hybrid detector array according to claim 4 wherein the detectors are fabricated of 8 to 14 micron band type Cadmium Mercury Telluride material.

6. A transfer device according to claim 1 wherein the substrate has a plurality of extended portions, each portion having associated therewith a pair of control electrodes by which means ambipolar carriers accumulated therein may be transferred to a common region of the device between the first and second current electrodes.

7. A transfer device according to claim 6 wherein the substrate and the extended portions thereof are of photoconductive material, so that ambipolar carriers may be generated photoelectrically therein.

8. A transfer device according to claim 7 wherein the material is of Cadmium Mercury Telluride.

9. A transfer device according to claim 1 wherein the detector means includes an output diode formed on the substrate.

10. A transfer device according to claim 1 wherein the detector means includes a third electrode spaced a distance apart from the second current electrode substantially twice the diffusion length of the ambipolar carriers in the semiconductor material.

* * * * *